US006489255B1

(12) United States Patent
Nguyen et al.

(10) Patent No.: US 6,489,255 B1
(45) Date of Patent: *Dec. 3, 2002

(54) LOW TEMPERATURE/LOW DOPANT OXIDE GLASS FILM

(75) Inventors: Son Van Nguyen, Hopewell Junction, NY (US); Christopher Joseph Waskiewicz, Poughkeepsie, NY (US); Donna Rizzone Cote, Poughguag, NY (US)

(73) Assignee: International Business Machines Corporation, Armonk, NY (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 1301 days.

(21) Appl. No.: 08/764,820

(22) Filed: Dec. 12, 1996

Related U.S. Application Data

(63) Continuation of application No. 08/461,092, filed on Jun. 5, 1995, now abandoned.

(51) Int. Cl.$^7$ ................... H01L 21/473; H01L 21/443; H01L 21/316
(52) U.S. Cl. ................ 438/784; 438/632; 438/787; 438/790
(58) Field of Search ............... 437/238, 240, 437/978, 982; 438/632, 790, 784

(56) References Cited

U.S. PATENT DOCUMENTS

| | | | | |
|---|---|---|---|---|
| 4,845,054 A | * | 7/1989 | Mitchener | 437/238 |
| 5,094,984 A | * | 3/1992 | Liu et al. | 437/235 |
| 5,104,482 A | * | 4/1992 | Monkowski et al. | 156/643 |
| 5,139,971 A | * | 8/1992 | Giridhar et al. | 437/195 |
| 5,166,101 A | * | 11/1992 | Lee et al. | 437/238 |
| 5,180,692 A | * | 1/1993 | Ibuka et al. | 437/240 |
| 5,231,058 A | * | 7/1993 | Maeda et al. | 437/235 |
| 5,250,468 A | * | 10/1993 | Matsuura et al. | 437/194 |
| 5,286,681 A | * | 2/1994 | Maeda et al. | 437/240 |
| 5,314,845 A | * | 5/1994 | Lee et al. | 437/238 |
| 5,336,640 A | * | 8/1994 | Sato | 437/240 |
| 5,354,387 A | | 10/1994 | Lee et al. | 148/33.3 |
| 5,405,489 A | * | 4/1995 | Kim et al. | 156/643 |
| 5,413,967 A | * | 5/1995 | Matsuda et al. | 437/235 |
| 5,462,899 A | * | 10/1995 | Ikeda | 437/238 |
| 5,484,749 A | * | 1/1996 | Maeda et al. | 437/228 |
| 5,525,551 A | * | 6/1996 | Ohta | 437/238 |
| 5,531,183 A | * | 7/1996 | Sivaramakrishnam | 437/238 |
| 5,576,247 A | * | 11/1996 | Yano et al. | 437/240 |
| 5,605,867 A | * | 2/1997 | Sato et al. | 437/238 |
| 5,705,028 A | * | 1/1998 | Matsumoto | 156/636.1 |

OTHER PUBLICATIONS

Sato et al., "Very Low Temp. CVD of SiO$_2$ . . . ", Abstract #9, pp. 31–33, Ma/1971.*

"Low Temperature Sub–Atmospheric CVD USG/PSG for Gap Filling and Planarization of Advanced Submicron Memory Devices", Yieh et al., Abstract No. 148, pp. 248–249; 1992.

(List continued on next page.)

*Primary Examiner*—Olik Chaudhuri
*Assistant Examiner*—Timothy J. Sutton
(74) *Attorney, Agent, or Firm*—Delio & Peterson, LLC; John J. Tomaszewski; Jay H. Anderson

(57) ABSTRACT

A layer of doped oxide glass is deposited on a semiconductor device in a chemical vapor deposition chamber by reacting gaseous sources of silicon, ozone and at least one boron or phosphorus dopant in a carrier gas, the ozone being present in a ratio of about 9–15 weight percent of the carrier gas. The deposited layer of doped oxide glass contains no greater than about 4 weight percent each of boron and phosphorus concentration and is annealed at a temperature no greater than about 700° C. for a time sufficient to soften and outgas any residual moisture in the oxide glass layer and level the upper surface to a desired degree.

17 Claims, 2 Drawing Sheets

OTHER PUBLICATIONS

"Very Low Temperature CVD of $SiO_2$ Films Using Ozone and Organosilane", Sato et al., Abstract No. 9, pp. 31–33; May 1971.

"Low Temperature Chemical Vapor Deposition of Dielectric Films Using Ozone and Organosilane", Nishimoto et al., pp. 447–450; 1987.

"CVD TEOS/$O_3$: Development History and Applications", Maeda et al., pp. 83–88; Jun. 1993.

"TEOS and Ozone Atmospheric Pressure CVD of Borophosilicate Glass Films Using Triethylborate and Trimethylphosphate", Fujino et al., J. Electrochem. Soc., vol. 140, No. 10, pp. 2922–2927; Oct. 1993.

"The National Technology Roadmap for Semiconductors", Semiconductor Industry Association; 1994.

"TC2. Advanced Dielectrics and Planarization: Materials and Processes", International Conference On Metallurgical Coatings and Thin Films, Nyugen et al.; Apr. 25, 1994.

"P5000 Dielectric CVD: 'Kaizen' Continuous Improvement", Nguyen; 1994.

* cited by examiner

LOW TEMPERATURE/LOW DOPANT OXIDE GLASS FILM

This is a continuation of application(s) Ser. No. 08/461,092 filed on Jun. 5, 1995, now abandoned.

BACKGROUND OF THE INVENTION

1. Field of the Invention

This invention relates to a method of manufacturing a semiconductor device and, in particular, to a method of forming a low temperature, low dopant oxide glass layer on the device.

2. Description of Related Art

As a result of the development of sub-half micron size gate conductors on complimentary metal oxides semiconductors (CMOS), it has become necessary to develop better layers over the semiconductors to provide electrical insulation. Oxide glass layers, particularly silicate glasses doped with boron and/or phosphorus, have been typically employed because the low melting temperatures have permitted the layers to be reheated to soften the glass and cause it to reflow to create a planar surface on the semiconductor device. It has been recognized that it is important to formulate and process these oxide glass films so that they have the ability to fill small gaps on the surface of the semiconductor device without retaining voids or bubbles within the oxide glass layer.

One recent oxide glass layer system is described in Maeda et al. U.S. Pat. No. 5,286,681 which discloses chemical vapor deposition (CVD) of a boron phosphorous silicate glass by reacting in the gaseous phase tetraethylorthosilicate (TEOS) and ozone ($O_3$), trimethylphosphate (TMP) and trimethylborate (TMB) in carrier gas. No concentrations of the ozone-, boron- or phosphate-containing gases are given, although the final boron phosphates silicate glass (BPSG) film is disclosed as having a boron concentration of 4 mole percent and a phosphorous concentration of 4 mole percent in a film layer thickness of 8000 angstroms. In U.S. Pat. No. 5,231,058, Maeda et al. describe a process for forming a CVD film utilizing a polysiloxane compound having at least 2 silicone-oxygen bonds with ozone which utilizes ozone concentrations of about 0.6 to 4 mole percent and trimethylphosphate and triethylborate in undisclosed concentrations.

Lee et al. U.S. Pat. Nos. 5,166,101 5,314,845 and 5,354,387 disclose CVD deposition of oxide glass layers using gaseous sources of phosphorus and boron dopants with ozone and tetraethylorthosilicate as a source of silicon. These patents disclose a two step process in which the second step forms a cap over the initially deposited layer of silicon oxide glass to prevent moisture absorption. This process requires high temperature annealing at about 850° C. to achieve void free fill on the semiconductor device. Additionally, the ozone layers are at approximately 1 vol. percent concentration carrier gas (equivalent to about 1.5 weight percent). No specific concentrations for the gaseous boron and phosphate sources are disclosed. In addition to requiring a second capping step, a deficiency of this system is that the film can not be used in advanced CMOS devices having for example 0.25 micrometer width gate conductors where the high temperature reflow of 850° C. would cause damage to the semiconductor device. This process is also unsuitable in devices where subsequent etching will expose the porous films that will absorb water and cause significant device and reliability problems.

Bearing in mind the problems and deficiencies of the prior art, it is therefore an object of the present invention to provide an improved layer and method of applying a layer of silicon oxide glass.

It is another object of the present invention to provide a method for depositing an oxide glass layer which may be formed in a single step and does not require a capping layer.

It is yet another object of the present invention to provide a silicon oxide glass layer with enhanced gap fill capability, i.e., improved step coverage/reflow angle, and to reduce incorporation of moisture into the layer if the device is subsequently etched or exposed to water.

It is yet another object of the present invention to provide a process for deposition of a silicon oxide glass layer on semiconductor devices which utilizes lower annealing temperatures.

Still other objects and advantages of the invention will in part be obvious and will in part be apparent from the specification.

SUMMARY OF THE INVENTION

The above and other objects, which will be apparent to those skilled in the art, are achieved in the present invention which provides a method of forming a chemical vapor deposited layer of doped oxide glass on a semiconductor device in a sub atmospheric or atmospheric chemical vapor deposition chamber comprising the steps of:

a) mixing and reacting gaseous sources of silicon, preferably tetraethylorthosilicate, ozone and at least one dopant selected from the group consisting of boron and phosphorus in a carrier gas over the semiconductor device, the ozone being present in a ratio of about 9–15 weight percent of the carrier gas and the dopant being present in an amount such that the deposited layer of oxide glass contains no greater than about 4 weight percent dopant concentration;

b) depositing a layer of doped oxide glass on the semiconductor device; and c) annealing the layer of doped oxide glass on the semiconductor device at a temperature no greater than about 700° C.

Preferably, the dopant comprises boron and phosphorous present in an amount of from about 1–3 weight percent of the deposited film layer, and the method utilizes an annealing temperature of between about 450 and 650° C. The annealing step (c) may take place during the depositing step (b) or during a subsequent processing step. The doped layer may be used to form a final chemical vapor deposition layer on the semiconductor device. The invention is especially useful where the semiconductor device is a sub-half micron metal oxide semiconductor.

BRIEF DESCRIPTION OF THE DRAWINGS

The features of the invention believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction with the accompanying drawings in which:

DESCRIPTION OF THE PREFERRED EMBODIMENT(S)

Figure 1:
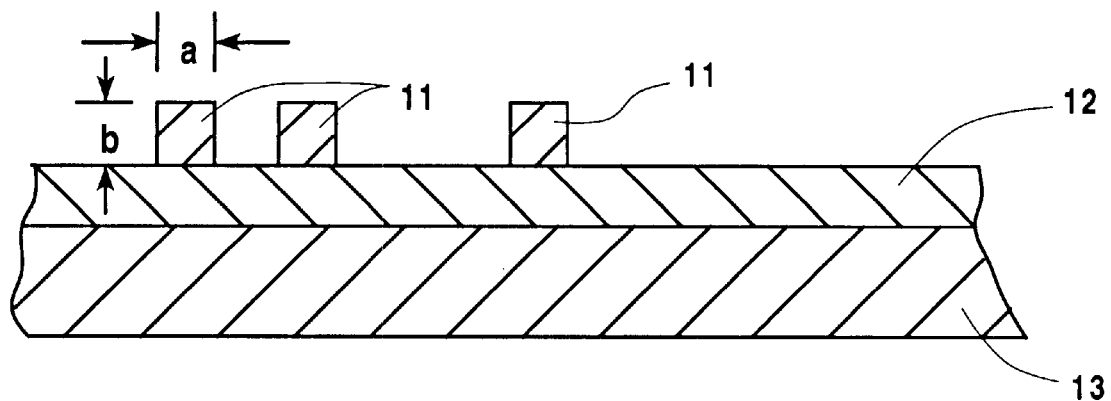
FIG. 1 is a side elevational view of a semiconductor device with an exposed stepped surface.
Figure 2:
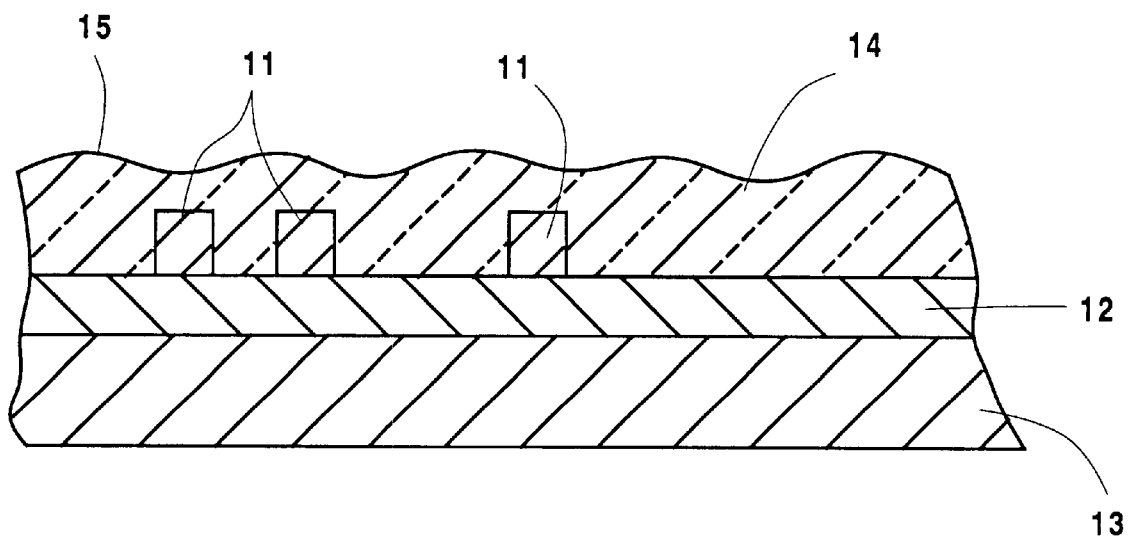
FIG. 2 is a side elevational view of a semiconductor device with an exposed stepped surface of FIG. 1 on which is deposited an oxide glass layer in accordance with the present invention.

In describing the preferred embodiment of the present invention, reference ill be made herein to FIGS. 1 and 2 of the drawings in which like numerals refer to like features of the invention. Features of the invention are not necessarily shown to scale in the drawings.

The doped oxide glass layer made in accordance with the present invention is intended as dielectric insulation for a semiconductor device such as a complimentary metal oxides semiconductor (CMOS) or other chip or electronic device in which an insulating layer with reflow characteristics is desirable. As used herein, the term "semiconductor device" includes any of the aforementioned devices, including DRAM and logic chips. As shown in FIG. 1, a semiconductor device has a metal alloy or polysilicon gate conductor film 11 formed on the surface of a silica film 12, which in turn is over a silicon substrate 13. Gate conductors 11 in the advanced devices for which the present invention is particularly useful typically have widths "a" less than 0.5 microns and heights "b" of 0.5–1.0 microns.

Made in a subatmospheric chemical vapor deposition chamber, the oxide glass film is preferably silica (SiO$_2$) containing a minor amount of boron and phosphorus, each under 5 weight percent, otherwise known as subatmospheric borophosphosilicate glass (SABPSG). Alternatively, the method of the present invention can be used to form borosilicate glass (BSG) or phosphosilicate glass (PSG).

The process of depositing the oxide glass layer is preferably performed by chemical vapor deposition (CVD) utilizing a gaseous source of silicon such as alkoxysilane, for example, tetraethylorthosilicate (Si(OC$_2$H$_5$)$_4$) (TEOS), which reacts with oxygen, a portion of which is supplied as ozone (O$_3$). Other sources of silicon which may be employed include polysiloxane compounds such as hexamethyldisiloxane, octamethylcyclotetrasiloxane (OMCTS), hexamethylcyclotrisiloxane and halide TEOS such as fluorinated tetraethylorthosilicate. The reactive, gaseous sources of silicon and oxygen may be mixed with carrier gases such as argon (Ar), nitrogen (N$_2$) or helium (He). The ozone gaseous component may also be supplied with O$_2$ as the balance of the gas.

It is significant to the present invention that the reactive oxygen compound, e.g., ozone, is present at a level which is sufficiently high to provide better gap fill characteristics, but not so high as to create significant surface sensitivity, form a porous, moisture absorptive film, or cause an explosion risk in the CVD apparatus. It has been found in the present invention that, in order to provide the advantages described herein, ozone may be utilized in concentrations of about 9 to about 15% by weight of the carrier gas. (Unless otherwise specified, all percentages are given in weight percentages.) By reacting the gaseous source of silicon with the ozone over the semiconductor device in a CVD apparatus, there is deposited a layer of SiO$_2$ film which provides the dielectric layer of insulation while filling the gaps in the underlining surface of the semiconductor device.

In order to reduce the surface sensitivity, that is, the ability of the layer to deposit essentially the same film thickness over various topology and provide a planar surface after subsequent annealing, there are provided boron and/or phosphorous dopants in the silicon oxide glass film. The boron and phosphorous are provided by gaseous sources of boron and phosphorous introduced into the CVD apparatus in admixture with the gaseous sources of silicon and oxygen (preferably TEOS and ozone, respectively) over the semiconductor device to be coated. The gaseous sources of boron and phosphorous should be selected so as not to interfere with deposition of the oxide glass while themselves decomposing to react with the other components to deposit or "dope" the boron and phosphorous in small quantities to sufficiently alter the properties of the silica layer. Preferred gaseous sources of boron are triethylborate (TEB), trimethylborate (TMB), (trimethylsilyl)borate and mixtures of same or other organic boron-containing gases. Preferred gaseous sources of phosphorous are triethylphosphine (TEP), triethylphosphite (TEPite), triethylphosphate (TEPO), trimethylphosphate (TMP) and (trimethylsilyl)phosphate and mixtures of same or other organic phosphorous-containing gases. More preferred gaseous sources of the dopants are TEB (B(OC$_2$H$_5$)$_3$) and TEPO (OP(OC$_2$H$_5$)$_3$). The remainder of the non boron and non phosphorus-containing components are removed with the other reacted and unreacted gases after deposition of the oxide glass layer on the semiconductor device.

Lee et al. disclose in their aforementioned patents that the amount of the gaseous sources of boron and phosphorous present in the carrier gas/gaseous source mixture may range from about 2 to 100 weight percent of the dopant/carrier gas mixture, although the actual examples do not disclose the amount of boron and/or phosphorus present in the deposited film layers. However, in the present invention, lower quantities of boron and/or phosphorous are utilized, preferably in amounts that produce oxide films having no greater than about 4 weight percent opant concentrations. Any concentration of boron and/or phosphorus in the carrier gas may be used which results in this low dopant concentration in the deposited layer.

Preferred CVD of the doped glass oxide layer of this invention is conducted at subatmospheric pressure, preferably in the range of from about 100 to 760 Torr. Other preferred conditions include a substrate or semiconductor device temperature of 400–650° C. and gas temperatures of less than 440° C. Deposition continues until a desired thickness of essentially void-free oxide glass is deposited on the stepped surface of the semiconductor device. The thickness of the doped oxide glass CVD layer may range from about 100 to about 100,000 angstroms.

As reacted with the oxide glass layer during deposition, boron may form B$_2$O$_3$ and phosphorus may form P$_2$O$_5$. Boron concentration in the layer may range from about 0 to 4 percent by weight of the layer, preferably from about 1 to 3 percent by weight. Phosphorus concentration in the layer may range from about 0 to 4 percent by weight of the layer, preferably from about 1 to 3 percent by weight.

At high ozone concentrations, 9 to 15 weight percent, it has been found that the gap-fill properties of boron and/or phosphorous doped silicate glasses are significantly enhanced. Without the dopants, surface sensitivity has been shown to suffer. It has been found that the low dopant concentration of boron and phosphorous in the oxide film layer (preferably in a 1 to 3 weight percent range) the deposited films have lower water absorption and are much more stable. It has also been found that both boron and phosphorous dissolve more readily at lower concentrations and do not form undesirable crystal phases. The low dopant oxide glass layer formed according to the present invention requires no capping or additional layers to protect against moisture absorption, and thus may be used as the final oxide glass layer on the semiconductor device.

Significantly, it has been found that the deposited doped oxide glass film requires much lower annealing temperature to remove moisture and to densify and stabilize the film. Suitable annealing may be carried out at a temperature below bout 700° C., preferably in the range of about 450° C. to about 650° C., more referably in the range of about 500° C. to about 600° C., for a time sufficient to soften and outgas any residual moisture in the oxide glass layer and level the upper surface to the desired degree, typically 30 minutes Annealing at these temperatures may be performed during or after deposition of the oxide glass layer.

As shown in FIG. 2, the semiconductor device has deposited over layers 11 and 12 a glass oxide layer 14 made in accordance with the present invention. After deposition and subsequent annealing, the surface 15 of oxide glass film 14 is substantially planar.

EXAMPLE

A silicon glass oxide film (BPSG) was produced in accordance with the aforementioned process in a CVD chamber, specifically, an AME Precision 5000 reactor. Susceptor (semiconductor device) temperature was 480° C., susceptor spacing was 220 mils (5.6mm) and chamber pressure was 600 Torr. TEB ampule temperature was 445° C., TEPO ampule temperature was 46° C. and TEOS ampule temperature was 46° C.

Ozone concentration was 12 weight percent with the balance of the gas being $O_2$. Gas flow rates were as follows: ozone—3000 standard cubic centimeters per minute; TEB—200 standard cubic centimeters per minute (about 4 mole percent of TEOS flow); TEOS 5000 standard cubic centimeters per minutes; and TEPO—800 standard cubic centimeters per minute (about 16 mole percent of TEOS flow). The film was deposited at a rate of 2000 angstroms per minute.

The susceptor received a deposited film thickness of 5667 angstroms. The BPSG film was stripped in a 10:1 distilled water/hydrogen fluoride solution and analyzed. Boron was found to be present in an amount of 3.32 weight percent of the film. Phosphorous was found to be present in an amount of 0.99 weight percent of the film.

Figure 3A:
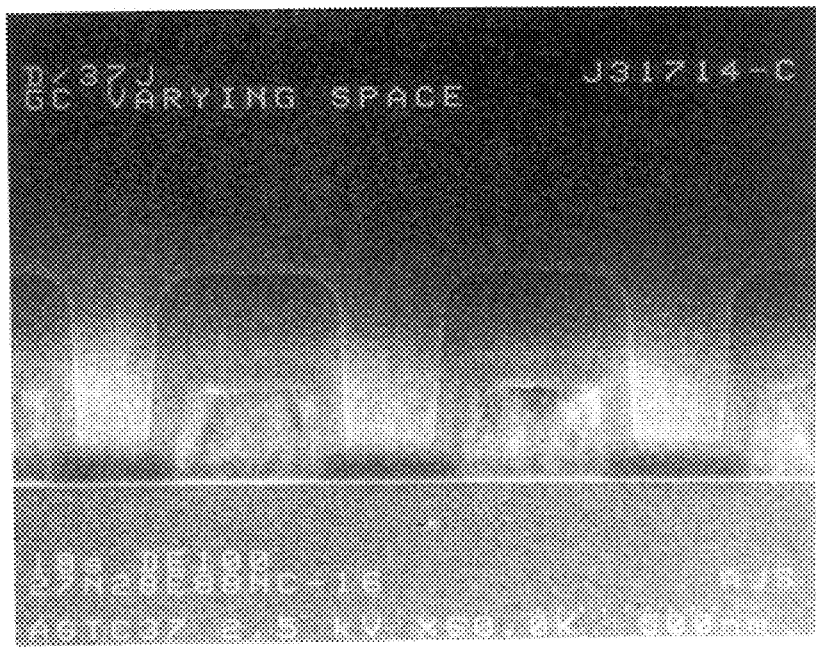
FIGS. 3a and 3b are scanning electron photomicrographs showing typical void-free gap fills of low boron, low phosphorus TEOS/O$_3$ CVD layers of the present invention over sub-half micron gate conductor devices.
Figure 3B:
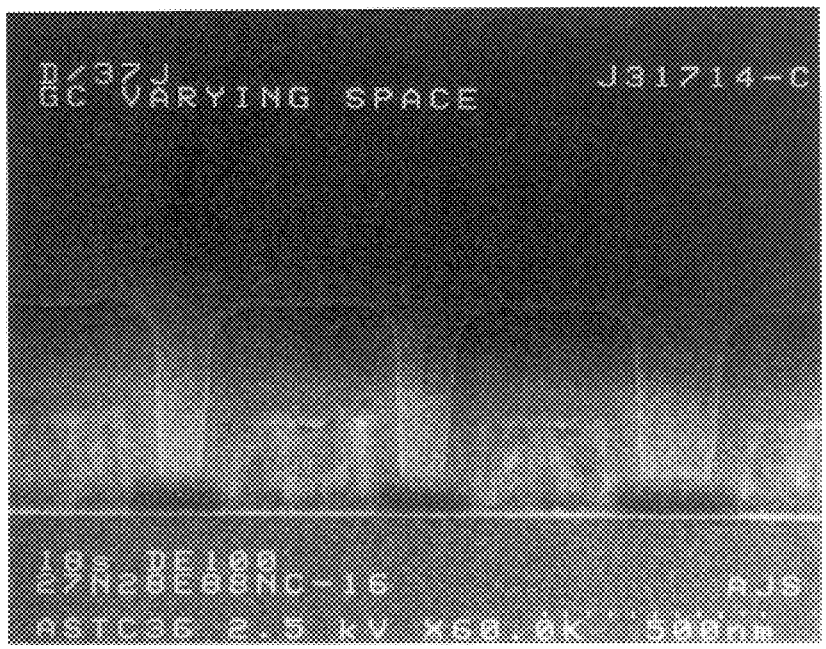

Scanning electron photomicrograph FIGS. 3a and 3b show typical void-free gap fills of low boron (about 0.1 weight percent of film layer), low phosphorus (about 3 weight percent of film layer) TEOS/$O_3$ CVD layers over sub-half micron gate conductor devices produced in accordance with the present invention. The film layers show no visible voids up to 0.1 micron openings.

It has been found that the present invention provides better gap-fill properties than that typically observed for sub-0.25 μm gate conductors filled with doped phosphorus oxide film with 3 weight percent phosphorus (FIGS. 3a and 3b). The high $O_3$ concentration makes the deposition precursors complex reflow more readily. Additionally, the low boron and phosphorous concentrations in the carrier as reduce surface sensitivity but are still sufficiently high to enhance etch rates for subsequent borderless contact (CB) annealing operations and to act as a mobile ion barrier. These low boron and phosphorous concentrations will also act to reduce surface sensitivity and defect formation problems. This system is suitable for 0.35 micrometer device requirements of CMOS DRAM and logic semiconductor devices and for sub-0.25 micrometer CMOS devices of the types shown in FIGS. 3a and 3b.

The present invention has been found to be particularly useful to produce low temperature gate conductor film in sub-half micron semiconductor devices especially when thin metal polycide ($TiSi_x$, $CoSi_x$, $NiSi_x$, and $PtSi_x$) gate conducting films are utilized, that is, where annealing temperatures below 700° C. are required in order to prevent damage to the metal polycide and to the device. The oxide glass layer may be provided as single final layer on the semiconductor device and requires no plasma or other capping step or layer. The film has been found to be good at reducing absorbed moisture in the glass oxide layer. Boron and phosphorus can be employed in these films at lower concentration since there is no need for high temperature reflow for planarization. The partial planarization on the surface is achieved by high ozone/TEOS flow ratio (i.e., high $O_3$ concentration).

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

Thus, having described the invention, what is claimed is:

1. A method of forming a single chemical vapor deposited layer of doped oxide glass on a semiconductor device in a chemical vapor deposition chamber consisting essentially of the steps of:
    a) mixing and reacting gaseous sources of silicon, ozone, oxygen and at least one of the dopants comprising boron and phosphorus over said semiconductor device, wherein said ozone and oxygen are present in admixture in relative amounts whereby said ozone is present in a ratio of about 9–15 weight percent in said oxygen-ozone mixture and said dopant being present in an amount such that the deposited layer of oxide glass contains no greater than about 4 weight percent of each dopant concentration;
    b) depositing a single layer of doped oxide glass on said semiconductor device with no greater than about 4 weight percent each of boron and phosphorus concentration; and
    c) annealing said single layer of doped oxide glass on said semiconductor device at a temperature no greater than about 700° C. for a time sufficient to reflow said layer.

2. The method of claim 1 wherein said annealing step (c) takes place during or after said depositing step (b).

3. The method of claim 1 wherein said dopant comprises boron and phosphorous.

4. The method of claim 1 wherein said dopant comprises boron.

5. The method of claim 1 wherein said dopant comprises phosphorous.

6. The method of claim 1 wherein said semiconductor device is a sub-half micron metal oxide semiconductor.

7. The method of claim 1 wherein said annealing temperature is between about 450 and 650° C.

8. The method of claim 1 wherein said step (b) depositing of said doped layer forms a final chemical vapor deposition layer on said semiconductor device.

9. The method of claim 1 wherein each dopant is present in an amount of from about 1–3 weight percent of the deposited film layer.

10. The method of claim 1 wherein said gaseous source of silicon comprises tetraethylorthosilicate.

11. A method of forming a single chemical vapor deposited layer of doped oxide glass on a sub half micron metal oxide semiconductor device in a chemical vapor deposition chamber consisting essentially of the steps of:
a) providing a metal oxide semiconductor device having sub-half micron gate conductor width in a sub atmospheric chemical vapor deposition chamber;
b) mixing and simultaneously reacting gaseous sources of silicon, ozone, oxygen and at least one of the dopants comprising boron and phosphorus over said semiconductor device, wherein said ozone and oxygen are present in admixture in relative amounts whereby said ozone is present in a ratio of about 9-15 weight percent in said oxygen-ozone mixture and said dopant being present in an amount such that the deposited layer of oxide glass contains no greater than about 4 weight percent of each dopant concentration;
c) as a result of step (b), depositing a final single chemical vapor deposition layer of doped oxide glass on said semiconductor device; and
d) annealing and single Jayer of doped oxide glass on said semiconductor device at a temperature between about 450 and 650° C. for a time sufficient to reflow and level said layer.

12. The method of claim 11 wherein said annealing step (d) takes place during or after said depositing step (b).

13. The method of claim 11 wherein said dopant comprises boron and phosphorous.

14. The method of claim 11 wherein said dopant comprises boron.

15. The method of claim 11 wherein said dopant comprises phosphorous.

16. The method of claim 11 wherein each dopant is present in an amount of from about 1–3 weight percent of the deposited film layer.

17. The method of claim 11 wherein said gaseous source of silicon comprises tetraethylorthosilicate.

* * * * *